(12) United States Patent
Nomura et al.

(10) Patent No.: US 10,699,877 B2
(45) Date of Patent: Jun. 30, 2020

(54) CHARGED-PARTICLE BEAM WRITING APPARATUS AND CHARGED-PARTICLE BEAM WRITING METHOD

(71) Applicant: NUFLARE TECHNOLOGY, INC., Yokohama-shi (JP)

(72) Inventors: Haruyuki Nomura, Yokohama (JP); Takashi Kamikubo, Minato (JP)

(73) Assignee: NUFLARE TECHNOLOGY, INC., Yokohama-shi (JP)

( * ) Notice: Subject to any disclaimer, the term of this patent is extended or adjusted under 35 U.S.C. 154(b) by 0 days.

(21) Appl. No.: 16/401,318

(22) Filed: May 2, 2019

(65) Prior Publication Data

US 2019/0355553 A1 Nov. 21, 2019

(30) Foreign Application Priority Data

May 16, 2018 (JP) ................................. 2018-094858

(51) Int. Cl.
| | | |
|---|---|---|
| *H01J 37/317* | (2006.01) | |
| *G03F 7/20* | (2006.01) | |
| *H01J 37/304* | (2006.01) | |

(52) U.S. Cl.
CPC ...... *H01J 37/3174* (2013.01); *G03F 7/70875* (2013.01); *H01J 37/304* (2013.01); *H01J 2237/30455* (2013.01)

(58) Field of Classification Search
USPC .................................................. 250/492.22
See application file for complete search history.

(56) References Cited

U.S. PATENT DOCUMENTS

| | | | |
|---|---|---|---|
| 5,912,096 A | 6/1999 | Hada | |
| 2007/0291243 A1* | 12/2007 | Suzuki | ................ G03F 7/70225 355/53 |
| 2011/0253892 A1* | 10/2011 | Yamaguchi | ............ B82Y 10/00 250/307 |
| 2015/0261099 A1* | 9/2015 | Yamanaka | .......... G03F 7/70141 355/67 |

FOREIGN PATENT DOCUMENTS

| | | |
|---|---|---|
| JP | 06-036997 | 2/1994 |
| JP | 10-261565 | 9/1998 |
| JP | 2003-188076 | 7/2003 |
| JP | 2011-066247 | 3/2011 |
| JP | 2012-119484 | 6/2012 |

* cited by examiner

*Primary Examiner* — Kiet T Nguyen
(74) *Attorney, Agent, or Firm* — Oblon, McClelland, Maier & Neustadt, L.L.P.

(57) ABSTRACT

A charged-particle beam writing apparatus includes a writing chamber to house a stage having a writing object placed thereon, a beam irradiator to irradiate a charged particle beam to the writing object placed on the stage, a stage driver to move the stage, a temperature distribution calculator to calculate temperature distribution of the writing object caused by a heat source in the writing chamber, based on movement history information of the stage, a deformed amount calculator to calculate a deformed amount of the writing object based on a constraint condition of the writing object placed on the stage and the calculated temperature distribution, and a position corrector to correct an irradiation position of the charged particle beam to the writing object based on the calculated deformed amount. The beam irradiator irradiates the charged particle beam based on the irradiation position corrected by the position corrector.

14 Claims, 15 Drawing Sheets

CHARGED-PARTICLE BEAM WRITING APPARATUS AND CHARGED-PARTICLE BEAM WRITING METHOD

CROSS REFERENCE TO RELATED APPLICATIONS

This application is based upon and claims the benefit of priority from the prior Japanese Patent Application No. 2018-94858, filed on May 16, 2018, the entire contents of which are incorporated herein by reference.

FIELD

Embodiments of the present disclosure relate to a charged-particle beam writing apparatus and a charged-particle beam writing method.

BACKGROUND

A lithography technique for improving resolution in wafer exposure with multi-patterning has attracted attention. Since multi-patterning requires extremely high positioning accuracy in exposure, what is important is beam irradiation-position accuracy (also referred to as global positional accuracy) of an electron-beam writing apparatus for producing a mask that becomes a master plate for transferring an LSI pattern to wafers. One factor that reduces the global positional accuracy is thermal deformation of a writing object (blank) during writing.

As a heat source located near the writing object, there are a magnetic lens coil and an alignment coil of an objective lens block, a vacuum exhaust pump of a writing chamber, etc. Although measures such as heat removal with water cooling, thermal shield, etc., are taken, it is impossible to completely block thermal flow into the writing object due to thermal radiation from those heat sources. The thermal flow causes thermal deformation of the writing object during writing to reduce the global positional accuracy.

SUMMARY OF THE INVENTION

According to the present embodiment, there is provided a charged-particle beam writing apparatus including:
a writing chamber to house a stage having a writing object placed thereon;
a beam irradiator to irradiate a charged particle beam to the writing object placed on the stage;
a stage driver to move the stage;
a temperature distribution calculator to calculate temperature distribution of the writing object caused by a heat source in the writing chamber, based on movement history information of the stage;
a deformed amount calculator to calculate a deformed amount of the writing object based on a constraint condition of the writing object placed on the stage and the calculated temperature distribution; and
a position corrector to correct an irradiation position of the charged particle beam to the writing object based on the calculated deformed amount,
wherein the beam irradiator irradiates the charged particle beam based on the irradiation position corrected by the position corrector.

DETAILED DESCRIPTION

Hereinbelow, embodiments will be explained with reference to the accompanying drawings. In the accompanying drawings of the present specification, for simplicity in drawings and easy understanding, the scale, the ratio of height to width, etc. are modified to be exaggerated from those of actual ones.

First Embodiment

Figure 1:
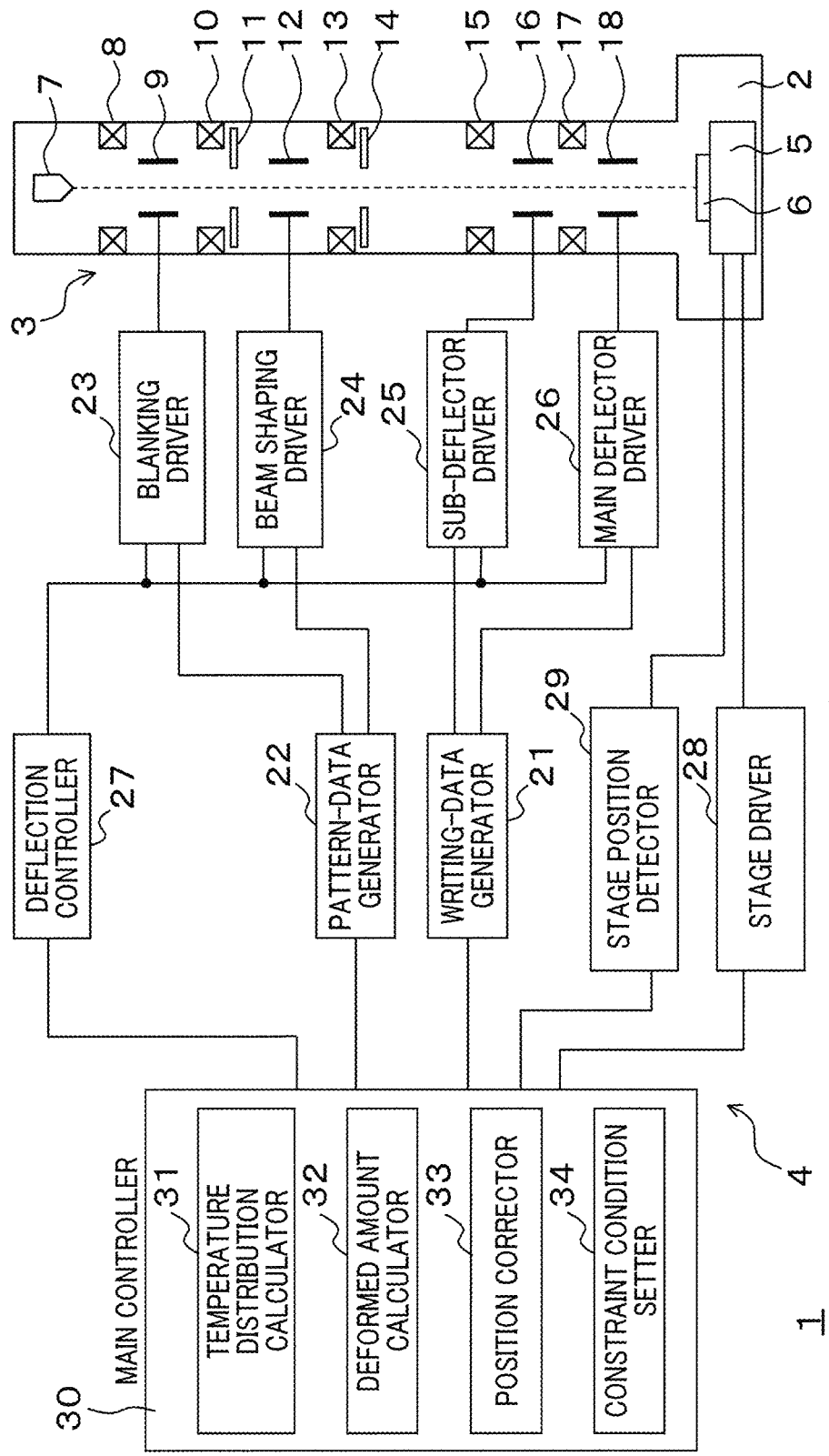
FIG. 1 is a block diagram schematically showing the configuration of a charged-particle beam writing apparatus, according to a first embodiment.

FIG. 1 is a block diagram schematically showing the configuration of a charged-particle beam writing apparatus 1 according to a first embodiment. In the following, as an example of the charged-particle beam writing apparatus 1, a writing apparatus using an electron beam will be mainly explained. However, the charged particle beam to be used in writing is not necessarily limited to the electron beam, which may be electromagnetic radiation such as an X-ray and a gamma ray. Moreover, writing may be performed using particle radiation such an α-ray, a β-ray, a proton ray, and a heavy ion ray.

The charged-particle beam writing apparatus 1 of FIG. 1 is provided with a writing chamber 2 for performing writing to a writing object 6, a lens barrel 3 for irradiating a charged particle beam to the writing chamber 2, and a control system 4 for controlling the lens barrel 3.

In the writing chamber 2, a stage 5 freely movable in a two-dimensional direction is provided and, the writing object 6 is placed on the stage 5. The writing object 6 is, for example, a mask substrate made of quartz, which is also referred to as a blank. The surface of the writing object 6 is covered with a resist film that is exposed to an electron beam.

The lens barrel 3 functions as a beam irradiator to irradiate an electron beam to the writing object 6 placed on the stage 5. The lens barrel 3 is provided, inside thereof, with an electron gun 7, a condenser lens 8, a blanking deflector 9, a first projection lens 10, an S1-aperture 11, a shaping deflector 12, a second projection lens 13, an S2-aperture 14, an intermediate lens 15, a sub-deflector 16, an objective lens 17, and an main deflector 18. The lens barrel 3 can have any internal configuration, not necessarily be the same as that of FIG. 1.

The electron gun 7 radiates an electron beam. The condenser lens 8 condenses the electron beam of the electron gun 7 and guides the condensed electron beam to the blanking deflector 9. When not performing writing, the blanking deflector 9 performs control to turn the electron beam aside. In other words, the blanking deflector 9 controls a shot time for irradiating the electron beam.

The S1-aperture 11 and the S2-aperture 14 are provided for processing an electron beam shape. The shaping deflector 12 performs control to orient an electron beam that has passed through the S1-aperture 11 toward the S2-aperture 14. In other words, the shaping deflector 12 controls a shot shape and a shot size. The first projection lens 10 guides an electron beam that has been deflected by the blanking deflector 9 to the S1-aperture 11. The second projection lens 13 guides an electron beam that has been deflected by the shaping deflector 12 to the S2-aperture 14. The intermediate lens 15 condenses an electron beam that has passed through the S2-aperture 14 and guides the condensed electron beam to the sub-deflector 16.

The sub-deflector 16 controls a shot position in a subfield which will be described later. The objective lens 17 condenses an electron beam that has been deflected by the sub-deflector 16 and guides the condensed electron beam to the main deflector 18. The main deflector 18 controls a center position of the subfield.

The objective lens 17 has a coil provided inside thereof. The coil becomes a heat source because a current flows therethrough. Moreover, an alignment coil is provided in the vicinity of the objective lens 17, which also becomes a heat source. Although a heat shield member, a cooling member, etc. are provided around the objective lens 17 and the alignment coil, if the cooling function is not enough for a required positional accuracy, heat may be transferred to the writing object 6 on the stage 5 to deform the writing object 6, which may reduce positional accuracy.

The control system 4 has a writing-data generator 21, a pattern-data generator 22, a blanking driver 23, a beam shaping driver 24, a sub-deflector driver 25, a main deflector driver 26, a deflection controller 27, a stage driver 28, a stage position detector 29, and a main controller 30.

The writing-data generator 21 generates writing data. The pattern-data generator 22 generates pattern data to be used in each shot. The blanking driver 23 and the beam shaping driver 24 drive the blanking deflector 9 and the shaping deflector 12, respectively, based on a deflection signal from the deflection controller 27 and the pattern data generated by the pattern-data generator 22, respectively. The sub-deflector driver 25 and the main deflector driver 26 drive the sub-deflector 16 and the main deflector 18, respectively, based on the deflection signal from the deflection controller 27 and the writing data generated by the writing-data generator 21, respectively.

The stage driver 28 moves the stage 5 in a two-dimensional direction based on an instruction from the main controller 30. The position of the stage 5 is detected by the stage position detector 29 and sent to the main controller 30. The main controller 30 controls respective components in the charged-particle beam writing apparatus 1 of FIG. 1.

Figure 2:
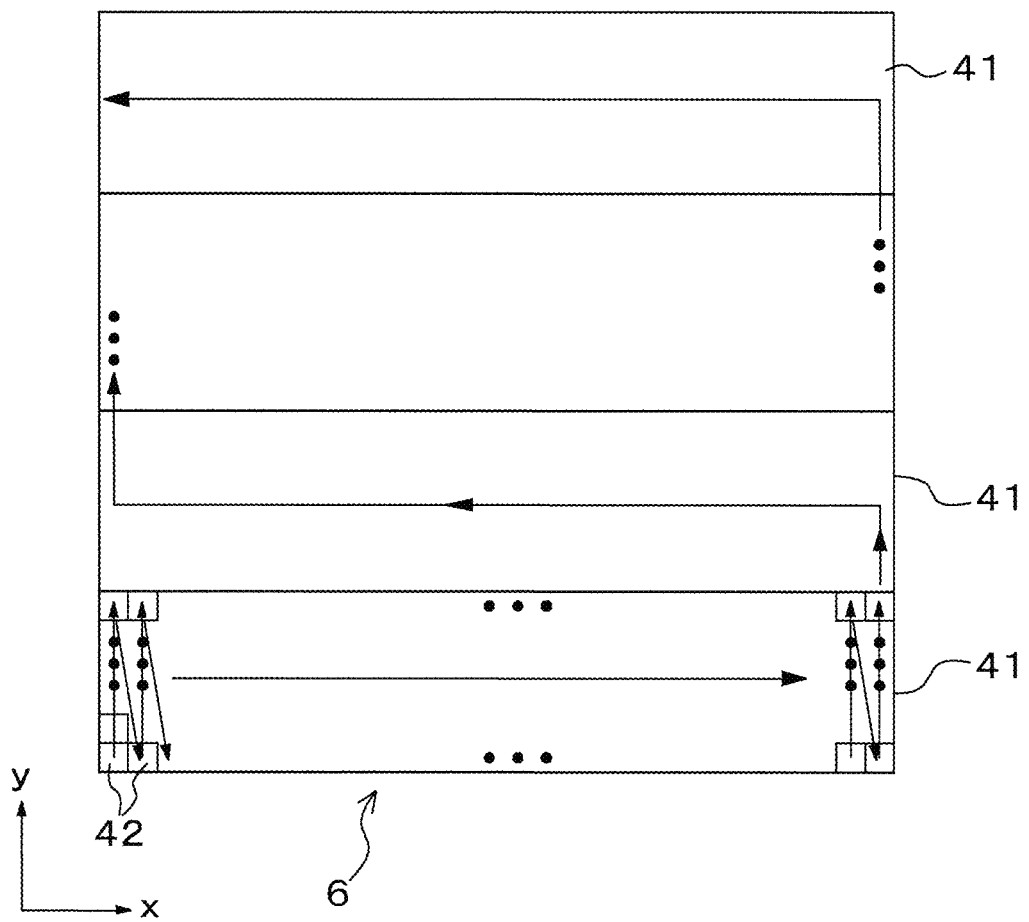
FIG. 2 is a figure explaining stripes and subfields.

In the present embodiment, as shown in FIG. 2, a writing area on the writing object 6 is divided into a plurality of strip-like stripes 41 having a width deflectable by the main deflector 18 in a Y-direction, and writing is performed per stripe 41. Each stripe 41 extends in an X-direction of the writing object 6, having a predetermined width in a Y-direction thereof. In FIG. 2, the lateral direction and the longitudinal direction of each stripe 41 are defined as the X-direction and the Y-direction, respectively. Each stripe 41 is divided into a plurality of subfields 42 each having a deflectable size for the sub-deflector 16. An electron beam is irradiated to each subfield 42 to perform writing of a desired pattern shape. The control of a center position in each subfield 42 is performed by the main deflector 18. Writing in each subfield 42 is referred to as a shot. The control of a shot position in each subfield 42 is performed by the sub-deflector 16. The control of a shot shape and a shot size in each subfield 42 is performed by the shaping deflector 12.

The stage driver 28, while moving the stage 5 in the X-direction, moves the stage 5 in the Y-direction by the number of subfields 42 in each stripe 41 in the Y-direction. In this way, writing can be performed for all subfields 42 in each stripe 41. When writing is finished for one stripe 41 in the writing object 6, writing is performed to the next stripe 41. In performing multiple writing, when writing for one stripe 41 is finished, for example, the stage 5 is moved by half of the stripe width in the Y-direction to perform writing for a new stripe 41. As described, in multiple writing, writing is repeated so that scanning ranges of each stripe 41 are overlapped with each other. Accordingly, since writing is performed to one subfield 42 by a plurality of times, pattern positional accuracy can be improved.

As shown in FIG. 1, the main controller 30 has a temperature distribution calculator 31, a deformed amount calculator 32, and a position corrector 33. The temperature distribution calculator 31 calculates temperature distribution of the writing object 6 caused by the heat source inside the writing chamber 2, based on movement history information of the stage 5. The movement history information includes position history information, and time history information or velocity history information of the stage 5 that has stayed at the positions recorded in the position history information. The deformed amount calculator 32 calculates a deformed amount of the writing object 6 based on a constraint condition of the writing object 6 placed on the stage 5 and the calculated temperature distribution. Based on the calculated deformed amount, the position corrector 33 corrects the irradiation position of a charged particle beam on the writing object 6. In more specifically, the position corrector 33 corrects the irradiation position of an electron beam per sub-field 42 in each stripe 41 based on the calculated deformed amount.

The main controller 30 may have a constraint condition setter 34. The constraint condition setter 34 sets a constraint condition in which one or more support portions, which have larger static friction on their contact surfaces with the writing object 6 than deformation stress on the writing object 6, are set as constraint points of the writing object 6, among a plurality of support portions. In this case, the deformed amount calculator 32 calculates the deformed amount of the writing object 6 based on the constraint condition set by the constraint condition setter 34 and the calculated temperature distribution.

In the present embodiment, since writing is performed per stripe 41 while moving the stage 5, the temperature distribution in the writing object 6 varies during the writing. The temperature distribution in the writing object 6 can be obtained by calculation relatively accurately without actual measurement by a radiation thermometer or the like.

The temperature distribution in the writing object 6 can be obtained, for example, by the heat conduction equation in the following expression (1). In the expression (1), K is thermal diffusivity [cm²/sec] of glass and β is time constant [sec] of heat radiation.

$$\frac{\partial T}{\partial t} = K\left(\frac{\partial^2 T}{\partial x^2} + \frac{\partial^2 T}{\partial y^2}\right) - \frac{1}{\beta}T \quad (1)$$

At time $t_i$, when the stage 5 stays in mask coordinates $(x_i, y_i)$ for $\Delta t_i$ seconds, a temperature increase $\Delta T_i(x, y, t)$ in the mask coordinates $(x_i, y_i)$ after t seconds caused by the heat source is expressed by the following expression (2). In the expression (2), L is a thickness [cm] of the writing object 6, p is density [g/cm³] of quartz glass, Cv is specific heat [J/g/K] of the quartz glass, W is a gross heating value [J/sec] flowing into the writing object 6 per unit of time, and σ is distribution [cm] of the heat source, assuming Gaussian.

$$\Delta T_i(x, y, t) = \qquad (2)$$
$$\frac{W\Delta t_i}{L\rho C_v} \cdot \frac{1}{\pi\{\sigma^2 + 4K(t-t_i)\}}\exp\left\{-\frac{(x-x_i)^2 + (y-y_i)^2}{\sigma^2 + 4K(t-t_i)}\right\}\exp\left(-\frac{t-t_i}{\beta}\right)$$

Temperature T (x, y, t) in given coordinates (x, y) at a given time t is expressed by the following expression (3) in which i is the movement history information of the stage 5 from writing start to the time t.

$$T(x,y,t) = \Sigma_i \Delta T_i(x_i, y_i, t_i, x, y, t) \quad (3)$$

Figure 3A:
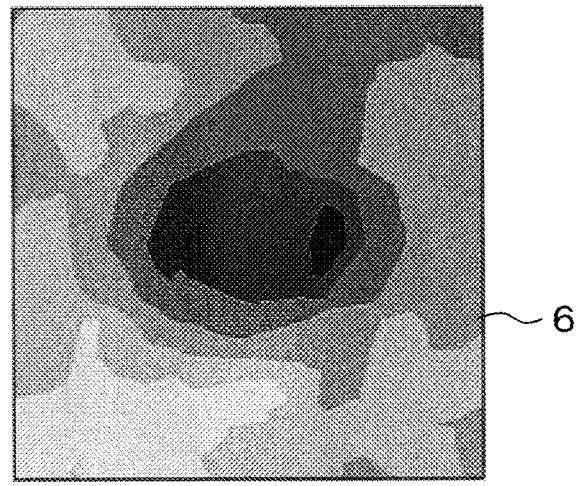
FIG. 3A is a figure showing a result of actual measurement of temperature distribution of a writing object.
Figure 3B:
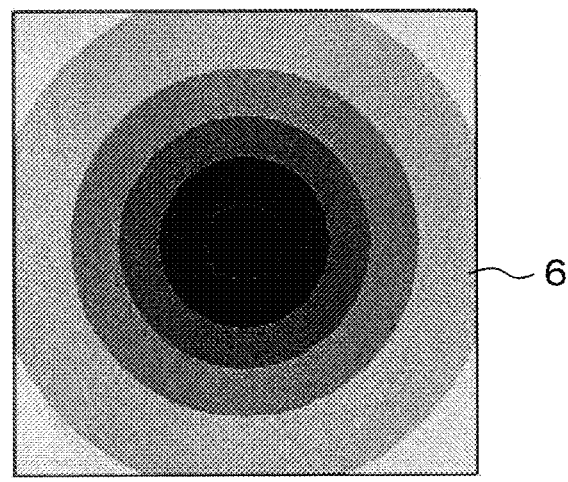
FIG. 3B is a figure showing a result of calculation of temperature distribution using expressions (1) to (3)

FIG. 3A is a figure showing a result of actual measurement of the temperature distribution of the writing object 6. FIG. 3B is a figure showing a result of calculation of the temperature distribution using the above-described expressions (1) to (3). In FIGS. 3A and 3B, a square mask substrate is used as the writing object 6, in which the calorific value W of the heat source, the time constant β of heat radiation, and the distribution a in the expression (2) are decided so that the result of calculation of FIG. 3B can correctly simulate the result of actual measurement of FIG. 3A when the heat source is placed on the center position of the mask substrate for one hour.

Figure 4:
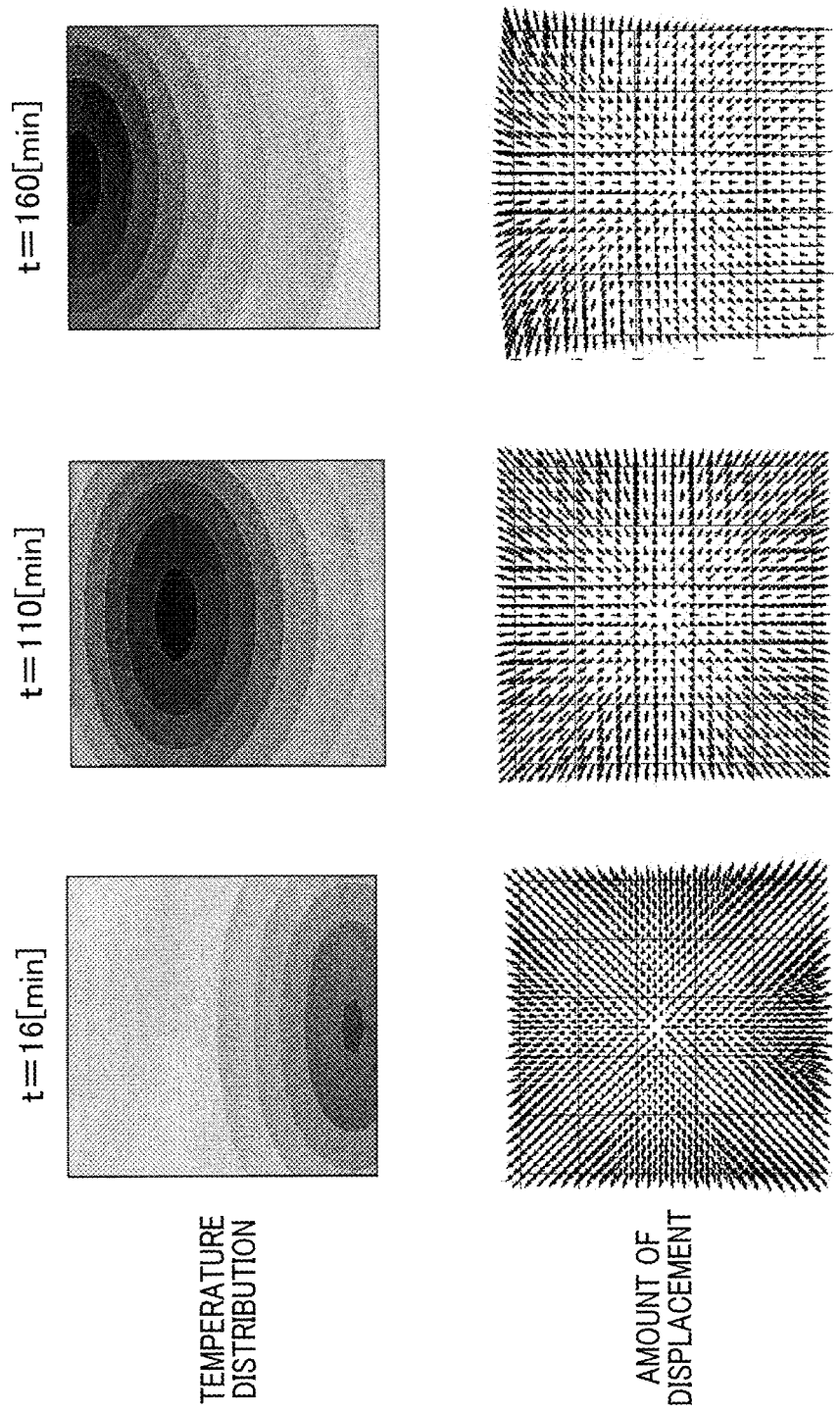
FIG. 4 is a figure showing a result of calculation of the temperature distribution and calculation of the amount of displacement of a mask substrate.

FIG. 4 is a figure showing a result of calculation of the temperature distribution and calculation of the amount of displacement of the mask substrate when the stage 5 on which the mask substrate is placed is moved with time, using the heat source decided in FIGS. 3A and 3B. FIG. 4 shows a result of calculation of the temperature distribution and the amount of displacement of the mask substrate, with no constraint points being provided on the mask substrate.

In FIG. 4, the temperature distribution at time t=16 [min], 110 [min], and 160 [min] is shown in the upper figures and the corresponding amount of displacement is shown in the lower figures. The amount of displacement is shown with arrow lines having a length and a direction expressing the magnitude and the direction, respectively, of the displacement at each position on the mask substrate.

In the figure of temperature distribution of FIG. 4, a deeper color region indicates a higher temperature. In the example of FIG. 4, since the stage 5 is moved downward in the figures with lapse of time, a region of higher temperature on the mask substrate moves upward, and along with it, a region of larger amount of displacement also moves upward, in the figures.

As described above, when performing electron-beam writing while moving the stage 5 on which the mask substrate is placed, the temperature distribution and amount of displacement of the mask substrate vary depending on the position of the stage 5. It is therefore desirable to correct the position to be irradiated with an electron beam in consideration of the temperature distribution and amount of displacement of the mask substrate.

Figure 5:
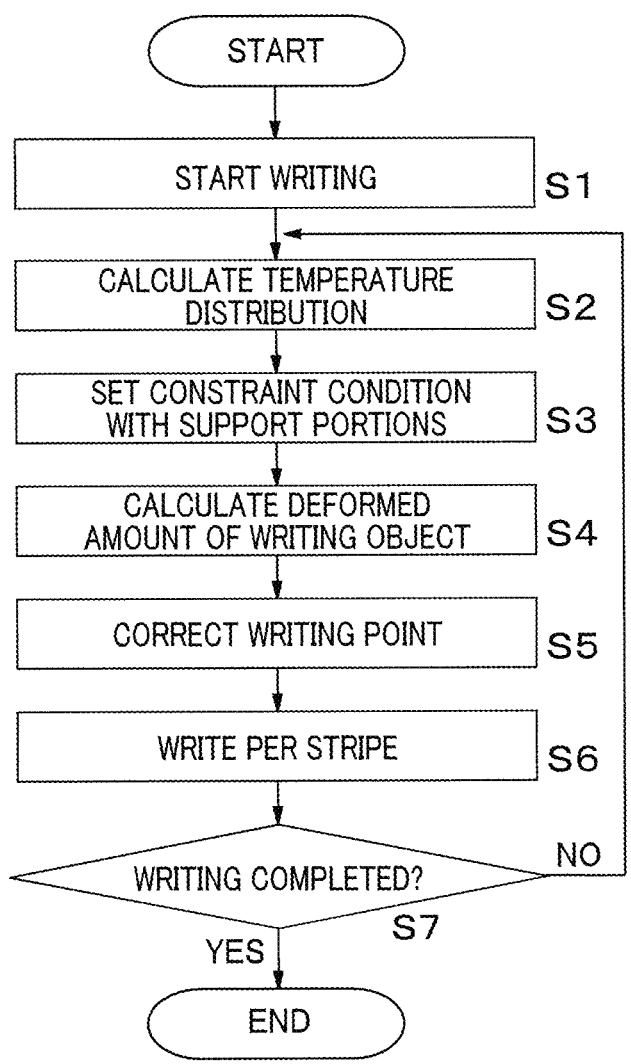
FIG. 5 is a flowchart showing a writing-position correction process according to the first embodiment.

FIG. 5 is a flowchart showing a writing-position correction process according to the first embodiment. It is a precondition of the flowchart of FIG. 5 that writing is performed for each stripe 41 of the writing object 6. The flowchart corrects a writing position per sub-field 42 in each stripe 41.

The flowchart of FIG. 5 is executed by the main controller 30 of FIG. 1. First of all, in response to a user instruction, electron beam writing to the writing object 6 starts (step S1). At this time, via an inputter not shown, information on the material, shape, etc. of the writing object 6 and the movement history information and the like of the stage 5 are acquired.

Subsequently, based on the above-described expressions (1) to (3), the temperature distribution at a given position on the writing object 6 is calculated (step S2). In this step S2, temperature distribution T (x, y, t) at a given position (x, y) and a given time t is calculated.

Figure 6:
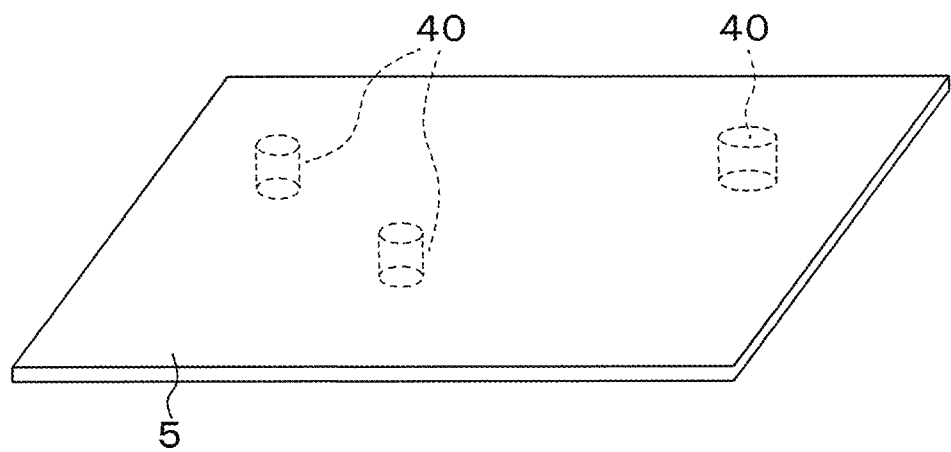
FIG. 6 is a figure showing an example of supporting the writing object with three support portions.
Figure 7:
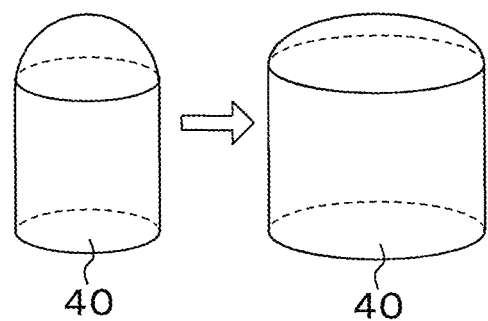
FIG. 7 is a figure explaining a support portion that becomes a constraint point.

Subsequently, a constraint condition of the writing object 6 is set (step S3). It is in general that the writing object 6 is supported by three or more support portions on the stage 5. FIG. 6 is a figure showing an example of supporting the writing object 6 with three support portions 40. All of the three or more support portions 40 are not necessarily restricted. In step S3, a constraint condition is set to define that, among the support portions 40, one or more support portions 40, at which the static friction force is larger than the deformation stress on the writing object 6, are set as constraint points. In order to have larger static friction force than the deformation stress on the writing object 6, for example, as shown in FIG. 7, it is considered that the support portion 40 is formed having a smaller curvature at the tip side to have a larger contact area with the writing object 6, having larger roughness on the contact portion with the writing object 6, and so on. As described, for the one or more support portions 40, at least one of the curvature at the tip side and the roughness on the contact portion with the writing object 6 may be adjusted to have larger static friction force on the contact surface with the writing object 6 than the deformation stress on the writing object 6.

Subsequently, based on the constraint condition set in step S3, for example, using the finite element method, a deformed amount $\Delta X_n$ ((v, w)T(x, y, t)) of the writing object 6 is calculated (step S4). Here, $\Delta X_n$ is the amount of displacement at an n-th node generated by division in the finite element method, and (v, w) are coordinates of the constraint points. The number of constraint points may be larger than one or the constraint points may be set for all of the support portions.

Subsequently, based on the deformed amount of the writing object 6, a writing point is corrected per subfield 42 in each stripe 41 of the writing object 6 (step S5). When the amount of correction at the origin coordinates of a k-th subfield 42 in each stripe 41 is expressed as $(\Delta x_k, \Delta y_k)$ and the amount of displacement at a node $n_k$ closest to the k-th subfield 42 is expressed as $(\Delta Xn_k, \Delta Yn_k)$, correction is made such as $(\Delta x_1, \Delta y_1)=(\Delta Xn_1, \Delta Yn_1)$, $(\Delta x_2, \Delta y_2)=(\Delta Xn_2, \Delta Yn_2)$, ..., $(\Delta x_k, \Delta y_k)=(\Delta Xn_2, \Delta Yn_2)$.

Subsequently, while moving the stage 5 in the two-dimensional direction, an electron beam is irradiated toward the writing point corrected in step S5 to perform writing per stripe 41 of the writing object 6 (step S6).

When writing is complete for one stripe 41, it is determined whether writing is complete for every stripe 41 (step S7). If there is a stripe 41 to be written, step S2 and the following steps are repeated. If writing is complete for every stripe 41, the process of FIG. 5 ends.

As described above, in the first embodiment, based on the movement history information of the stage 5, the temperature distribution of the writing object 6 caused by the heat source in the writing chamber 2 is calculated, and based on the calculated temperature distribution and the constraint condition of the writing object 6, the deformed amount of the writing object 6 is calculated. In this way, the electron-beam irradiation position can be controlled in consideration of the influence of the heat source in accordance with the movement history information of the stage 5 and the constraint condition of the writing object 6, so that writing positional accuracy can be improved. In writing to the writing object 6 per stripe 41, the stage 5 moves frequently in the two-dimensional direction and a high-temperature location on the writing object 6 changes accordingly. However, according to the present embodiment, since the temperature distribution of the writing object 6 is calculated based on the movement history information of the stage 5, the deformed amount of the writing object 6 can be calculated accurately even though the temperature distribution of the writing object 6 varies with time.

Moreover, in the first embodiment, the constraint condition is set to define that the support portion 40 at which the static friction force is larger than the deformation stress is set as the constraint point, among three or more support portions 40 that support the writing object 6. Therefore, the deformed amount of the writing object 6 can be calculated in consideration of the constraint condition of the writing object 6, so that deformed-amount calculation accuracy can be improved.

Second Embodiment

A second embodiment is different from the first embodiment in the constraint condition decision method. A charged-particle beam writing apparatus 1 according to the second embodiment has the same block configuration as that of FIG. 1.

The constraint condition setter 34 in the main controller 30 of FIG. 1 sets a constraint condition to define the position of zero in displacement on the writing object 6 as a constraint point, based on a difference between an position error of the writing position in the case of writing to the writing object 6 by an beam irradiator based on a first writing pattern, and an position error of the writing position in the case of writing to the writing object 6 by the beam irradiator based on a second writing pattern, under the condition in which the temperature distribution of the writing object 6 is different from that in the case of writing to the writing object 6 based on the first writing pattern, and also based on temperature distribution of the writing object 6 calculated by the temperature distribution calculator 31 after writing with the first writing pattern but before writing with the second writing pattern.

Figure 8:
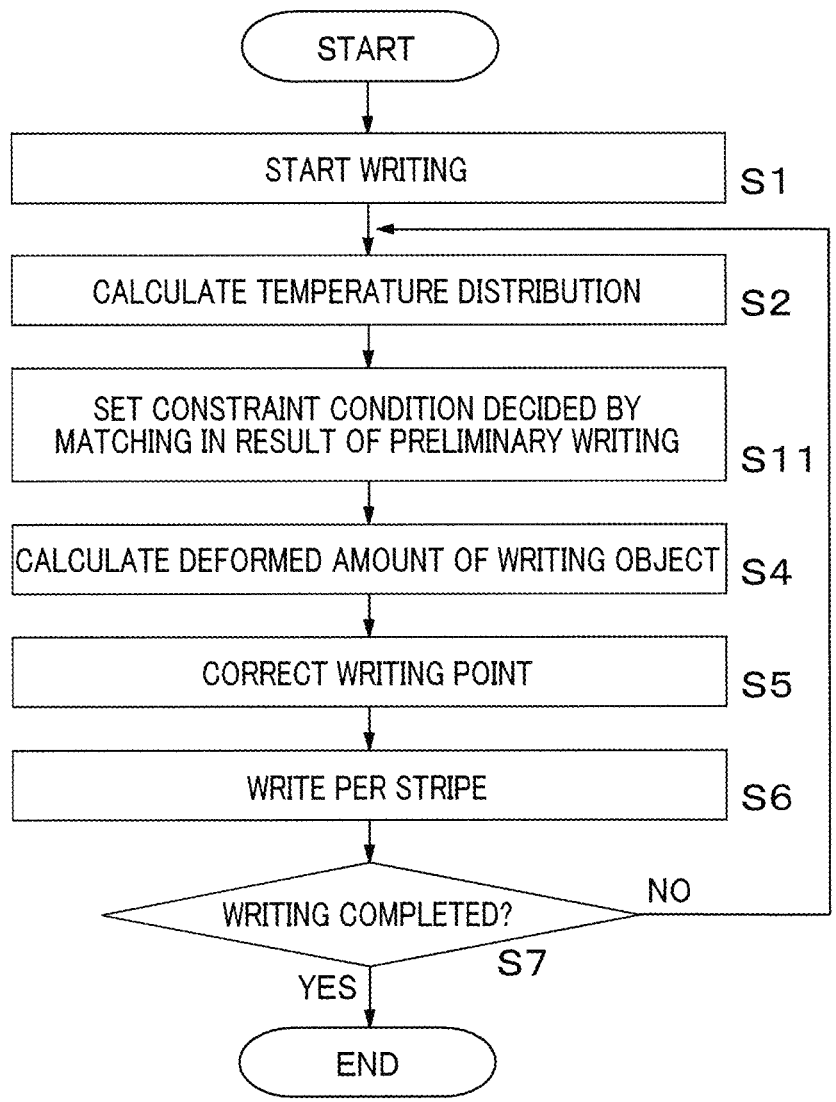
FIG. 8 is a flowchart showing a writing-position correction process according to a second embodiment.
Figure 9A:
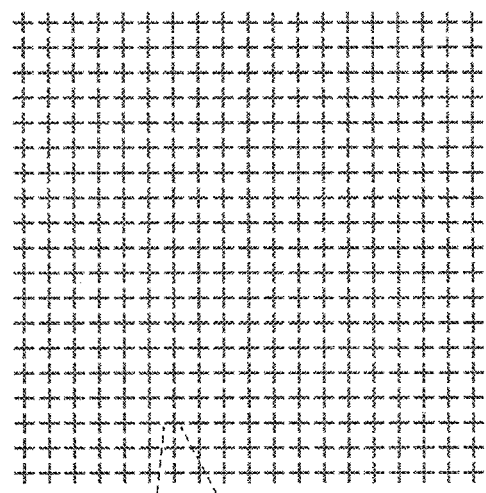
FIG. 9A is a figure showing grids.
Figure 9B:
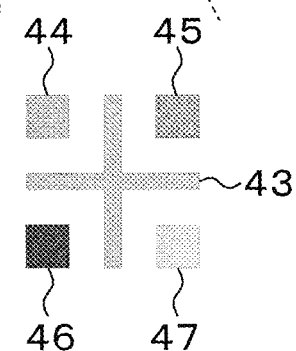
FIG. 9B is a figure showing a writing pattern that forms a grid.

FIG. 8 is a flowchart showing a writing-position correction process according to the second embodiment. In FIG. 8, step S11 is executed instead of step S3 of FIG. 5. In step S11, a constraint condition is set which is decided by matching in a result of preliminary writing. In the preliminary writing, for example, as shown in FIG. 9A, 19×19 grids are written on the writing object 6. Each grid includes a cross-like pattern and four rectangular patterns, for example, as shown in FIG. 9B.

Hereinbelow, among the patterns that form each grid, the cross-like pattern, the left-upper rectangular pattern, the right-upper rectangular pattern, the left-lower rectangular pattern, and the right-lower rectangular pattern are referred to as a 1S-pattern 43, a 2S-pattern 44, a 3S-pattern 45, a 4S-pattern 46, and a 5S-pattern 47, respectively. These 1S- to 5S-patterns 43 to 47 are written at different timings as described later.

Figure 10A:
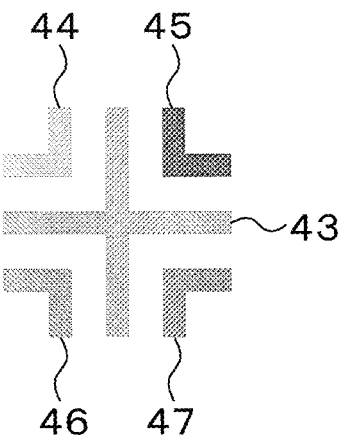
FIG. 10A is a figure showing one modification example of a grid pattern.
Figure 10B:
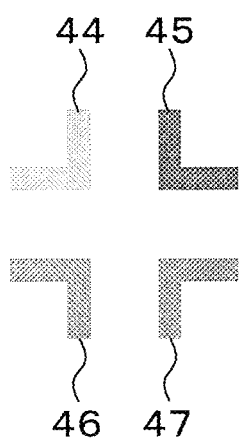
FIG. 10B is a figure showing another modification example of the grid pattern.
Figure 10C:
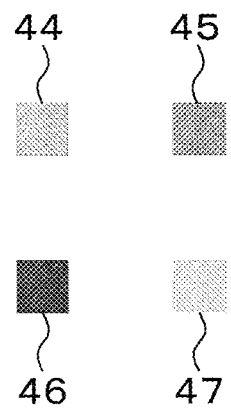
FIG. 10C is a figure showing still another modification example of the grid pattern.

The number of grids in the writing object 6 and the grid pattern in actual use can be freely decided. For example, as shown in FIG. 10A, the shapes of the 2S- to 5S-patterns 44 to 47 of FIG. 9B may be changed. As shown in FIG. 10B, the 1S-pattern 43 may be omitted from FIG. 10A. Moreover, as shown in FIG. 10C, the 1S-pattern 43 may be omitted from FIG. 9B.

Figure 11:
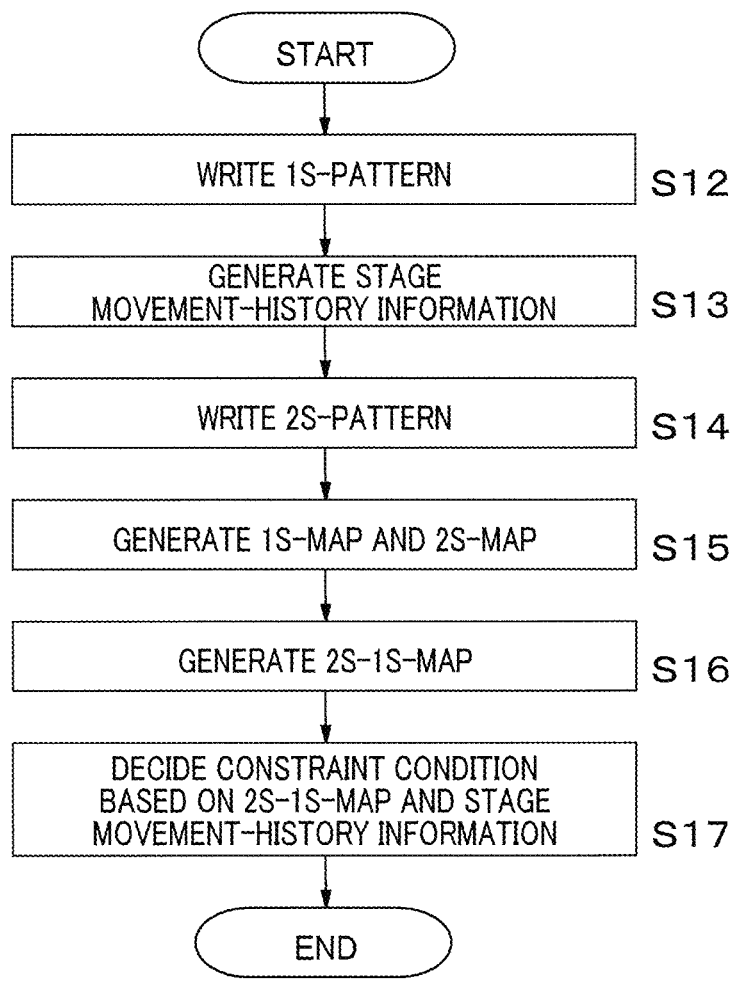
FIG. 11 is a flowchart showing a detailed process in step S11 of FIG. 8.

FIG. 11 is a flowchart showing a detailed procedure of constraint condition decision with matching in the preliminary writing of FIG. 8. First of all, the 1S-pattern 43 is written on each of the 19×19 grids of a writing object 6 (step S12). The writing object 6 to be written here is a writing object 6 for the preliminary writing, which is provided apart from the writing object 6 for real writing.

Subsequently, after writing of the 1S-pattern 43, the movement history information of the stage 5 is acquired (step S13). Subsequently, the 2S-pattern 44 is written on each of the 19×19 grids of the writing object 6 (step S14). The reason why the movement history information of the stage 5 is acquired before writing the 2S-pattern 44 is to write the 2S-pattern 44 under temperature distribution different from that of the 1S-pattern 43 to generate a position error map.

Figure 12:
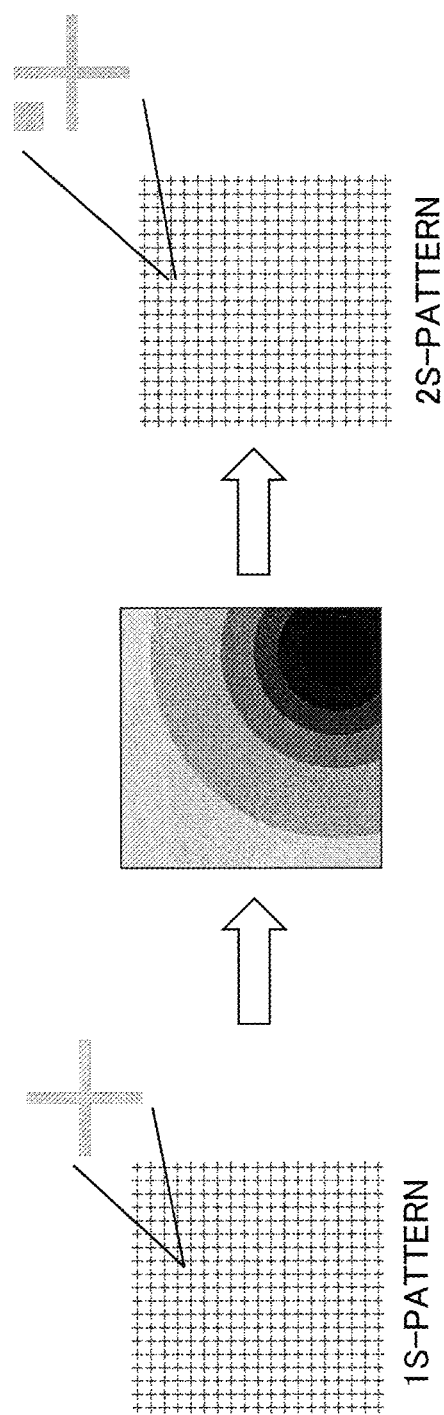
FIG. 12 is a figure schematically showing steps S12 to S14 of FIG. 11.

FIG. 12 is a figure schematically showing steps S12 to S14 of FIG. 11. FIG. 12 shows an example of writing in which, after the 1S-pattern 43 is written, the stage 5 is put in a waiting mode at the location where the temperature is highest at the right-lower corner of the writing object 6, and thereafter the 2S-pattern 44 is written. In this case, in writing the 1S-pattern 43 and in writing the 2S-pattern 44, the temperature distribution of the writing object 6 is different, and hence the deformed amount of the writing object 6 is also different, which causes different position errors between the 1S-pattern 43 and the 2S-pattern 44.

Figure 13A:
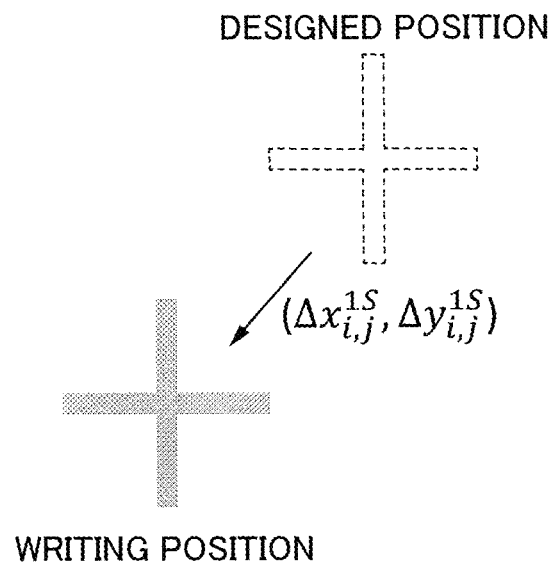
FIG. 13A is a figure showing a position error between a designed position of and an actual position of a 1S-pattern.
Figure 13B:
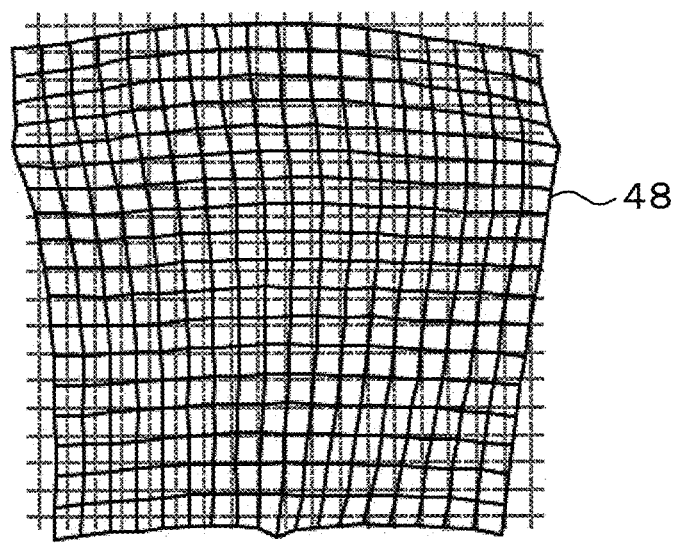
FIG. 13B is a figure showing a 1S-map into which position errors of the 1S-pattern are mapped.
Figure 14A:
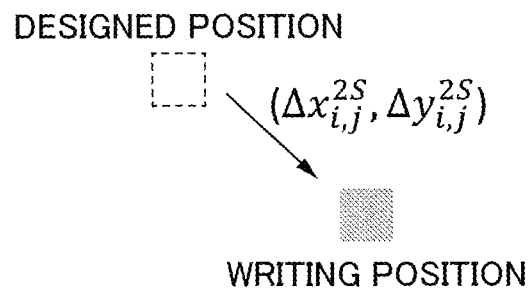
FIG. 14A is a figure showing a position error between a designed position of and an actual position of a 2S-pattern.
Figure 14B:
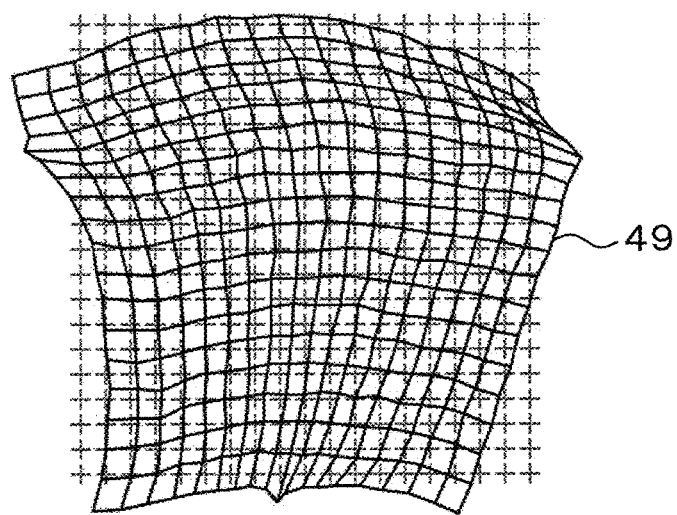
FIG. 14B is a figure showing a 2S-map into which position errors of the 2S-pattern are mapped.

Accordingly, as shown in FIG. 13A, a position error is obtained between a writing point (designed point) of the 1S-pattern 43 in design and an actual writing point of the 1S-pattern 43. Then, as shown in FIG. 13B, a 1S-map 48 is generated into which position errors of grids are mapped. Likewise, as shown in FIG. 14A, a position error is obtained between a writing point of the 2S-pattern 44 in design and an actual writing point of the 2S-pattern 44. Then, as shown in FIG. 14B, a 2S-map 49 is generated into which position errors of grids are mapped (step S15).

Subsequently, a 2S-1S-map (differential map) is generated into which a difference between the 1S-map 48 and the 2S-map 49 is mapped (step S16).

Subsequently, a matching process is performed based on the 2S-1S-map and the movement history information of the stage 5 generated in step S13 to decide a constraint condition that defines the position on the writing object 6 where the displacement is zero as a constraint point (step S17).

In order to improve the accuracy of constraint points, a procedure is repeated in order of acquiring the movement history information of the stage 5 after writing the 2S-pattern 44→writing the 3S-pattern 45→acquiring the movement history information of the stage 5→writing an n-th S-pattern→acquiring the movement history information of the stage 5. In this way, the positional accuracy on the writing object 6 with displacement of zero can be improved, so that the constraint condition can be decided more accurately.

When the constraint condition is decided in step S11 of FIG. 8, the same steps as steps S4 to S7 of FIG. 5 are executed to calculate the deformed amount of the writing object 6 in consideration of the temperature distribution based on the movement history information of the stage 5 and the constraint condition of the writing object 6, and then, writing is performed after the correction of the irradiation position of an electron beam, based on the calculated deformed amount.

As described above, in the second embodiment, preliminary writing is performed under different temperature distribution to obtain a differential map of position errors and, based on the differential map and the temperature distribution, a position on the writing object 6 where the displacement is zero is decided as the constraint point, so that constraint condition decision accuracy can be improved. Moreover, by increasing the kinds of grid patterns written in one-time preliminary writing and of stage-movement history information to repeatedly perform comparison of differential maps, the constraint condition decision accuracy can further be improved and also the deformed amount of the writing object 6 can be accurately estimated.

Third Embodiment

A third embodiment is different from the first and second embodiments in the process up to the correction of an electron-beam irradiation position.

Figure 15:
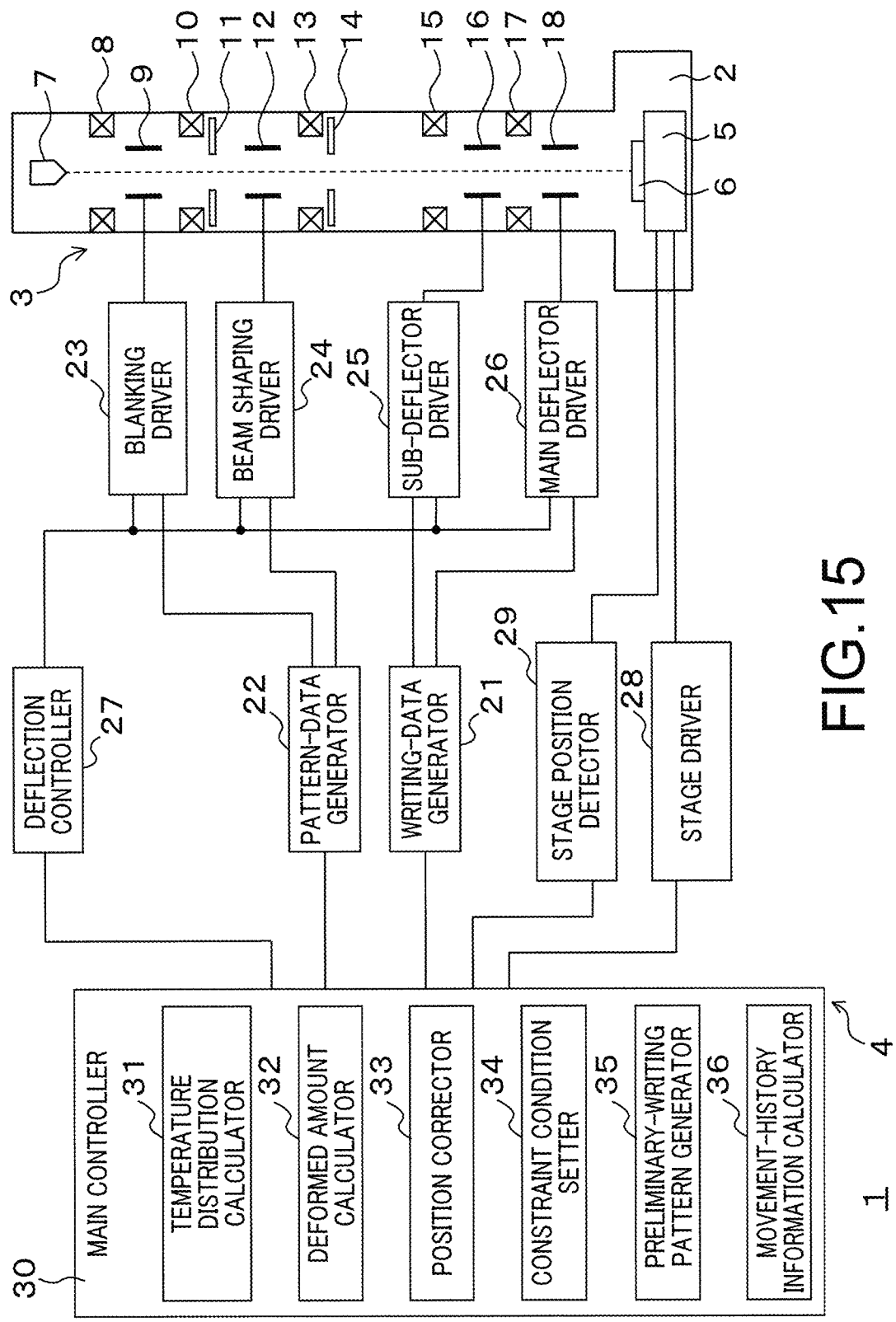
FIG. 15 is a block diagram schematically showing the configuration of a charged-particle beam writing apparatus according to a third embodiment.

FIG. 15 is a block diagram schematically showing the configuration of a charged-particle beam writing apparatus 1 according to the third embodiment. FIG. 15 is different from FIG. 1 in the internal configuration of the main controller 30, the other being identical to each other. The main controller 30 of FIG. 15 has a preliminary-writing pattern generator 35 and a movement-history information calculator 36, in addition to the temperature distribution calculator 31, the deformed amount calculator 32, the position corrector 33, and the constraint condition setter 34, like shown in FIG. 1. The preliminary-writing pattern generator 35 generates layout information including a writing pattern to be written on the writing object 6 for preliminary writing. The movement-history information calculator 36 calculates movement history information of the stage 5, which is obtained from the generated writing pattern. The temperature distribution calculator 31 calculates temperature distribution of the writing object 6 based on the movement history information calculated by the movement-history information calculator 36. The deformed amount calculator 32 calculates a deformed amount of the writing object 6 based on the constraint condition of the writing object 6 placed on the stage 5 and the temperature distribution calculated based on the movement history information. The position corrector 33 generates a position correction map for the correction of a charged-particle beam irradiation position in the writing object 6 based on the calculated deformed amount. The beam irradiator starts writing to the writing object 6 based on the position correction map generated by the position corrector 33.

Figure 16:
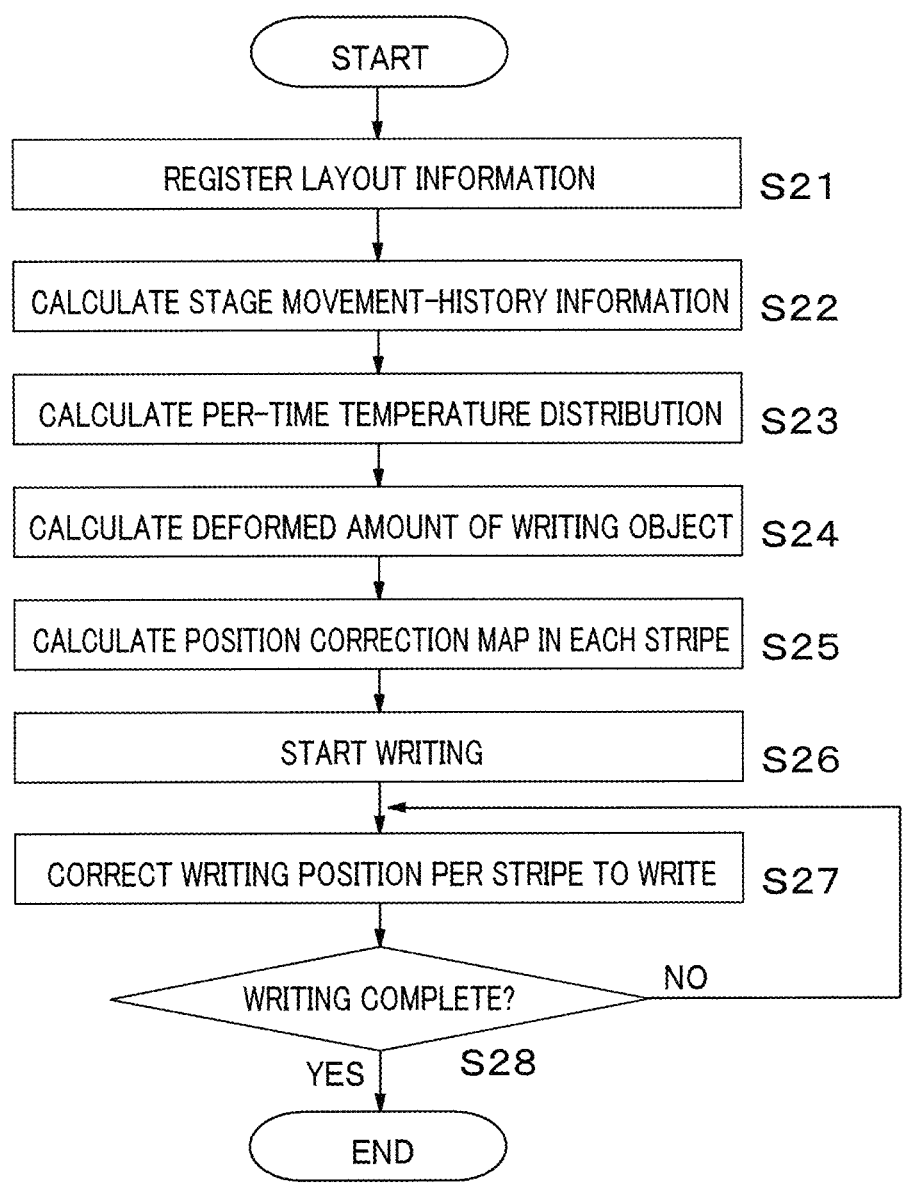
FIG. 16 is a flowchart showing a writing-position correction process according to the third embodiment.

FIG. 16 is a flowchart showing a writing-position correction process according to the third embodiment. First of all, layout information including a writing pattern for preliminary writing is generated by the preliminary-writing pattern generator 35 and registered in storage not shown (step S21). Subsequently, based on the layout information, movement history information of the stage 5 is calculated by the movement-history information calculator 36 (step S22). Subsequently, temperature distribution of the writing object 6 at each time is calculated by the temperature distribution calculator 31 (step S23). Subsequently, a deformed amount of the writing object 6 at each time is calculated by the deformed amount calculator 32 (step S24). Subsequently, a position correction map in the stripes 41 is calculated by the position corrector 33 for each of the stripes 41 of the writing object 6 (step S25).

The above-described steps S21 to S25 can be executed in a calculation process by the main controller 30, without actual writing to the writing object 6.

When step S24 is completed, actual writing to the writing object 6 starts (step S26). In detail, for each stripe 41 of the writing object 6, while the stage 5 is being moved in the two-dimensional direction, an electron-beam irradiation position is corrected in accordance with the position correction map obtained in step S25 to perform writing (step S27). Subsequently, it is determined whether there is a stripe 41 for which writing has not been completed (step S28). If there is a stripe 41 for which writing has not been completed, steps S27 and S28 are repeated, and when writing for all stripes 41 is completed, the process of FIG. 16 ends.

As described above, in the third embodiment, before actual writing to the writing object 6, the temperature distribution is calculated in a calculation process from the layout information to calculate a deformed amount of the writing object 6 and, based on the calculated deformed amount, the position correction map in the stripes 41 is calculated, and thereafter, actual writing to the writing object 6 is performed using the position correction map. Therefore, since in actual writing, writing position correction can be performed utilizing the position correction map obtained in a calculation process beforehand, a writing process can be performed at a higher speed.

At least part (for example, the main controller 30) of the control system 4 of the charged-particle beam writing apparatus 1 according to the above-described embodiments may be configured with hardware or software. When it is configured with hardware, the hardware includes an electronic circuit. When it is configured with software, a program that performs at least part of the functions of the control system 4 may be stored in a storage medium such as a flexible disk and CD-ROM, and then installed in a computer to run thereon. The storage medium may not be limited to a detachable one such as a magnetic disk and an optical disk but may be a standalone type such as a hard disk and a memory.

Moreover, a program that achieves at least part of the functions of the control system 4 may be distributed via a communication network a (including wireless communication) such as the Internet. The program may also be distributed via an online network such as the Internet or a wireless network, or stored in a storage medium and distributed under the condition that the program is encrypted, modulated or compressed.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A charged-particle beam writing apparatus comprising:
   a writing chamber to house a stage having a writing object placed thereon;
   a beam irradiator to irradiate a charged particle beam to the writing object placed on the stage;
   a stage driver to move the stage;
   a temperature distribution calculator to calculate temperature distribution of the writing object caused by a heat source in the writing chamber, based on movement history information of the stage;
   a deformed amount calculator to calculate a deformed amount of the writing object based on a constraint condition of the writing object placed on the stage and the calculated temperature distribution; and
   a position corrector to correct an irradiation position of the charged particle beam to the writing object based on the calculated deformed amount,
   wherein the beam irradiator irradiates the charged particle beam based on the irradiation position corrected by the position corrector.

2. The charged-particle beam writing apparatus of claim 1 further comprising:
   a plurality of support portions to support the writing object on the stage; and
   a constraint condition setter to set a constraint condition defining one or more support portions as a constraint point of the writing object, among the plurality of support portions, the one or more support portions having a contact surface with the writing object, static friction force on the contact surface being larger than deformation stress on the writing object,
   wherein the deformed amount calculator calculates the deformed amount of the writing object based on the constraint condition set by the constraint condition setter and the calculated temperature distribution.

3. The charged-particle beam writing apparatus of claim 2, wherein, for the one or more support portions, at least one of curvature at a tip side of the one or more support portions and roughness on a contact portion of the one or more support portions with the writing object is adjusted so that static friction force on the contact surface with the writing object becomes larger than the deformation stress on the writing object.

4. The charged-particle beam writing apparatus of claim 1 further comprising a constraint condition setter to set the constraint condition to define a position of zero in displacement on the writing object as a constraint point, based on a difference between position errors of writing positions in writing to the writing object by the beam irradiator under different temperature distribution of the writing object and based on temperature distribution of the writing object.

5. The charged-particle beam writing apparatus of claim 4, wherein the constraint condition setter sets the constraint condition to define the position of zero in displacement on the writing object as the constraint point, based on a difference between position errors of writing positions in writing a plurality of preliminary writing patterns different from one another to the writing object by the beam irradiator under different temperature distribution and based on the temperature distribution of the writing object in writing the plurality of preliminary writing patterns.

6. The charged-particle beam writing apparatus of claim 1 further comprising:
   a preliminary-writing pattern generator to generate a preliminary writing pattern to be written to the writing object; and
   a movement-history information calculator to calculate movement history information of the stage from the generated preliminary writing pattern,
   wherein the temperature distribution calculator calculates the temperature distribution of the writing object based on the movement history information,
   the deformed amount calculator calculates the deformed amount of the writing object based on the constraint condition of the writing object placed on the stage and the temperature distribution calculated based on the movement history information,
   the position corrector corrects the irradiation position of the charged particle beam in the writing object based on the calculated deformed amount, and
   the beam irradiator starts writing to the writing object based on the irradiation position corrected by the position corrector.

7. The charged-particle beam writing apparatus of claim 1 wherein the stage driver moves the writing object in a first direction and a second direction crossing each other,
   the beam irradiator performs writing to the writing object for each of a plurality of stripes extending in the first direction of the writing object and having a predetermined width in the second direction,
   the plurality of stripes are arranged in the first direction and in the second direction, the stripes having a plurality of sub-fields to be irradiated with the charged particle beam from the beam irradiator, and
   the position corrector corrects the irradiation position of the charged particle beam for each of the plurality of sub-fields in the stripes based on the calculated deformed amount.

8. A charged-particle beam writing method comprising:
   calculating temperature distribution of a writing object based on movement history information of a stage having the writing object placed thereon, the temperature distribution being caused by a heat source in a writing chamber;
   calculating a deformed amount of the writing object based on a constraint condition of the writing object placed on the stage and the calculated temperature distribution;
   correcting an irradiation position of a charged particle beam to the writing object based on the calculated deformed amount; and
   irradiating the charged particle beam based on the corrected irradiation position.

9. The charged-particle beam writing method of claim 8 further comprising:

supporting the writing object on the stage with a plurality of support portions; and setting a constraint condition defining one or more support portions as a constraint point of the writing object, among the plurality of support portions, the one or more support portions having a contact surface with the writing object, static friction force on the contact surface being larger than deformation stress on the writing object, wherein the calculation of the deformed amount of the writing object is performed based on the set constraint condition and the calculated temperature distribution.

10. The charged-particle beam writing method of claim 9 further comprising adjusting, for the one or more support portions, at least one of curvature at a tip side of the one or more support portions and roughness on a contact portion of the one or more support portions with the writing object, so that static friction force on the contact surface with the writing object becomes larger than the deformation stress on the writing object.

11. The charged-particle beam writing method of claim 8 further comprising setting the constraint condition to define a position of zero in displacement on the writing object as a constraint point, based on a difference between position errors of writing positions in writing to the writing object under different temperature distribution of the writing object and based on temperature distribution of the writing object.

12. The charged-particle beam writing method of claim 11, wherein the constraint condition is set to define the position of zero in displacement on the writing object as the constraint point, based on a difference between position errors of writing positions in writing a plurality of preliminary writing patterns different from one another to the writing object under different temperature distribution and based on the temperature distribution of the writing object in writing the plurality of preliminary writing patterns.

13. The charged-particle writing method of claim 8 further comprising:

generating a preliminary writing pattern to be written on the writing object;

calculating movement history information of the stage from the generated preliminary writing pattern;

calculating the temperature distribution of the writing object based on the movement history information;

calculating the deformed amount of the writing object based on the constraint condition of the writing object placed on the stage and the temperature distribution calculated based on the movement history information;

correcting the irradiation position of the charged particle beam in the writing object based on the calculated deformed amount; and starting writing to the writing object based on the corrected irradiation position.

14. The charged-particle writing method of claim 8 further comprising:

moving the writing object placed on the stage in a first direction and a second direction crossing each other;

performing writing to the writing object for each of a plurality of stripes extending in the first direction of the writing object and having a predetermined width in the second direction, the plurality of stripes being arranged in the first direction and in the second direction, the stripes having a plurality of sub-fields to be irradiated with the charged particle beam; and correcting the irradiation position of the charged particle beam for each of the plurality of sub-fields in the stripes based on the calculated deformed amount.

* * * * *